United States Patent [19]

Fogg

[11] Patent Number: 5,767,740
[45] Date of Patent: Jun. 16, 1998

[54] SWITCHING AMPLIFIER CLOSED LOOP DUAL COMPARATOR MODULATION TECHNIQUE

[75] Inventor: John K. Fogg, Norwood, Mass.

[73] Assignee: Harris Corporation, Melbourne, Fla.

[21] Appl. No.: 722,354

[22] Filed: Sep. 27, 1996

[51] Int. Cl.[6] .................. H03F 3/38; H03F 3/217
[52] U.S. Cl. ............................. 330/10; 330/251
[58] Field of Search ..................... 330/10, 207 A, 330/251; 381/120, 121

[56] References Cited

U.S. PATENT DOCUMENTS

| | | | |
|---|---|---|---|
| 3,579,132 | 5/1971 | Ross | 330/10 |
| 4,004,246 | 1/1977 | Hamada | 330/10 |
| 4,059,807 | 11/1977 | Hamada | 330/10 |
| 4,249,136 | 2/1981 | Suzuki et al. | 330/251 |
| 4,403,196 | 9/1983 | Grandmont | 330/10 |
| 4,554,512 | 11/1985 | Aiello | 330/10 |
| 4,949,048 | 8/1990 | Tokumo et al. | 330/10 |
| 5,014,016 | 5/1991 | Anderson | 330/10 |
| 5,115,205 | 5/1992 | Holmes | 330/10 |
| 5,160,896 | 11/1992 | McCorkle | 330/251 |
| 5,410,592 | 4/1995 | Wagner et al. | 379/388 |
| 5,479,337 | 12/1995 | Voigt | 363/131 |

*Primary Examiner*—Steven Mottola
*Attorney, Agent, or Firm*—Jaeckle Fleischmann & Mugel, LLP

[57] ABSTRACT

A dual comparator pwm audio amplifier has a differential-to-single ended feedback amplifier 40 coupled to an integrating amplifier 42 to provide more precise feedback control for the comparators 12, 16.

7 Claims, 3 Drawing Sheets

SWITCHING AMPLIFIER CLOSED LOOP DUAL COMPARATOR MODULATION TECHNIQUE

BACKGROUND

This invention relates in general to switching Class D audio amplifiers and, in particular, to full bridge dual comparator audio Class D amplifiers.

Many Class D amplifiers have output filters with inductors. Inductors are very expensive and the cost of a Class D amplifier can be reduced by eliminating the output filters and the costly inductors. Well known single comparator pulse width modulator (pwm) architectures require output filtering whereas dual comparator architectures do not. The elimination of output filters is a major improvement for dual comparators over single comparators. The dual comparators reduce reactive power consumption and eliminate the inductor/capacitor output filter network. Unfortunately, as will be explained hereinafter, the dual comparators have a complex closed loop. As a result, the dual comparators do not track the output of the bridge circuit accurately enough for high quality audio applications where variances of one or two percent are unacceptable. The following discussion will explain how the problems of the prior art arose and how the dual comparator overcame the problem of the single comparator but created further tracking problems.

A classical single comparator pwm amplifier is shown in FIG. 1A. The audio input is fed into an integrating amplifier 11. The output of the integrator 11 is fed into a single comparator 12. The other input to comparator 12 is a modulating triangle wave. The output of comparator 12 is a pulse width modulated signal representing the desired output. In a full bridge system, the pwm output is used to drive one pair of mosfets on one side of the H-bridge 20. A complementary pwm signal is generated by inverting the pwm output of comparator 12. The complementary pwm signal is used to drive the other pair of mosfets on the other side of the full bridge 24. Feedback in the system is taken directly across the bridge outputs 20, 22 by an inverting differential amplifier 19 which converts the differential bridge output to a single ended signal referenced to the same ground as the input integrator 11. The output of amplifier 19 is the second input to the integrator 11. The integrator 11 integrates the sum of the audio input and the inverted output, forcing the difference between these two signals to zero, and forcing the output of the bridge to follow exactly the audio input.

FIG. 2A shows the wave forms associated with the single comparator pwm architecture. All four gate drive signals to the H-bridge are derived from the single pwm signal output from the comparator 12 of FIG. 1A. That architecture has only two output states defined for the load across terminals 20 and 22, +VBUS and −VBUS respectively. When there is no audio input, the output at the speaker must be zero. To achieve an output of zero at the speaker, the H-bridge must produce a square wave with a 50% duty cycle switching between +VBUS and −VBUS. An output filter 70 averages the square wave to produce a zero output at the speaker. If the output filter 70 is removed from this circuit, the speaker itself must perform the averaging of the bridge output. Because of the resistive nature of the speaker, the RMS power at the switching frequency would be dissipated in the speaker. This is unacceptable and the dual comparator architecture of FIG. 2A overcomes that deficiency.

FIG. 1B shows a typical prior art dual comparator pwm amplifier. Such a dual comparator pwm amplifier does not require a filter. There an audio input is fed into a first comparator 12. The audio input is also fed into an inverting amplifier 14 and from there into a second comparator 16. Each comparator also receives a modulating triangular wave signal. The respective comparators 12, 16 output a series of pulses $V_A$, $V_B$ that drive the power mosfets in full bridge 50. Inverters 36, 38 connected to the outputs of pwm comparators 12, 16 generate complementary pulses. So, gate driver circuit 18 receives input pulses AHI, ALI, BHI and BLI. The gate driver circuit 18 may include DMOS or quasi-vertical DMOS power transistors that generate output gate driver signals AHO, BHO, ALO, and BLO. Those output signals are applied to the gates of the power mosfets 52, 54, 56, and 58 in the full H-bridge 24. Bridge output terminals 20, 22 are connected across a speaker 26. The output terminals 20, 22 are also coupled via amplifiers 30, 32 to the respective inputs A and B of the bridge driver circuit 18 and provide feedback signals for the signals AHI, ALI, BHI, and BLI.

The switching sequence of FIG. 2B shows a dual comparator switching technique performed by the circuit shown in FIG 1B. FIG. 2B requires two pulse trains $V_A$, $V_B$, representing the two pwm comparator outputs 12, 16, to define all four gate voltages for the H-bridge 24. The H-bridge output voltages across the speaker has three output states, +VBUS, −VBUS, and 0V. The addition of the 0V output state eliminates the need for a bridge output filter. This is especially true at light loads where the output of bridge 24 is zero for a large portion of the audio period when small +VBUS and −VBUS spikes are averaged to produce the peaks of the low amplitude sign wave output. In effect, the speaker 26 acts as its own filter to convert the pulses back to analog auto signals.

It is a feature of the architecture of the dual comparator that there are two control signals, one for one side (AHO) and one for the another side (BHO). Of course, each has a complementary signal (ALO, BLO, respectively) to control the other transistors in the bridge. However, since there are two feedback signals for controlling the opposites sides of the bridge, those skilled in the art have used two feedback paths for separately controlling the separated driving signals. As shown in FIG. 2A, the outputs of the bridge are fed back through respective inverters 30, 32 to the respective inputs of the gate driver 18 so that output 20 will correct the A side of the bridge and output 22 will correct the B side of the bridge.

The architecture of FIG. 1B cannot precisely match the output of the H-bridge to the audio input. This is due to the presence of two feedback paths, one for each control signal. The feedback paths are closed so that each side of the bridge 50 is forced to track the square wave of the output from one of the two pulse width modulators. One feedback path is from output 20 via inverter 30 to the AHI and ALI input of gate driver circuit 18 and the other is from output 22 via inverter 32 to the BHI and BLI inputs of gate driver circuit 18. The paths are closed so that the opposite sides of the bridge 24 are forced to track one of the square wave inputs $V_A$ and $V_B$ from the pulse width modulators 12, 16. One drawback of this technique is that the differential output voltage of the H-bridge 24 is not tracked and only a limited range of feedback is allowed. The bridge output voltage is in the order of 60–80 volts, whereas the gate driver circuit 18 is of the order of about 5 volts. The feedback from the H-bridge has to be reduced from 60–80 volts to about 5 volts and such reduction adversely affects the accuracy of the feedback. The dual feedback path design results in poor power supply rejection and increased harmonic distortion.

Accordingly, there is a need for a circuit that achieves the reduced output filter requirements of the dual comparator circuit of FIG. 1B but achieves accurate input and output tracking similar to the single comparator pwm amplifier.

SUMMARY OF THE INVENTION

The invention provides a dual comparator pulse width modulated switching audio Class D amplifier that has a novel feedback technique. With the invention, a differential amplifier converts the output of the H-bridge into a single ended feedback signal. The feedback signal is summed with the audio input signal and integrated to produce a control voltage for one comparator. The control voltage for the other comparator is generated by inverting the control voltage of the first comparator. The second input to both comparators is a triangle wave. The outputs of the two comparators, the pwm signals, are applied to a gate driver circuit and the gate driver circuit drives the gates of four mosfets configured as an H-bridge. The load or speaker is connected directly across the outputs of the H-bridge without the need for any filtering. The feedback path and the input integrator smooth and scale the output pulses of the H bridge and the circuit more accurately tracks the input signal.

DETAILED DESCRIPTION

Figure 1A:
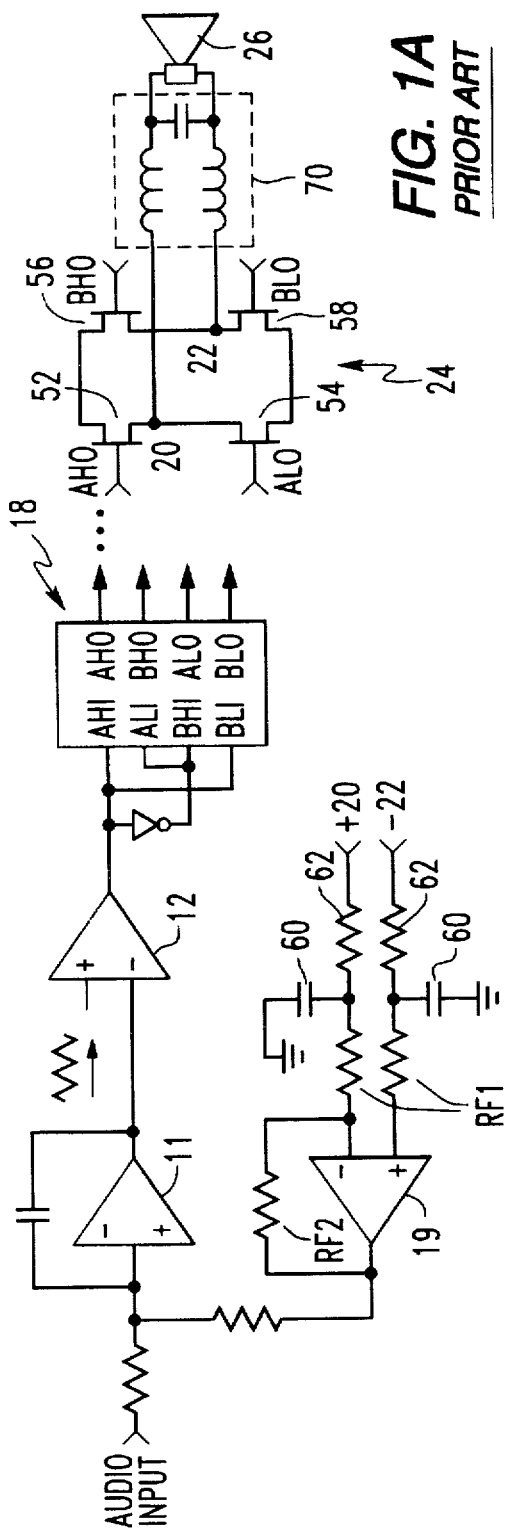
FIG. 1A shows a prior art single comparator pwm amplifier.
Figure 1B:
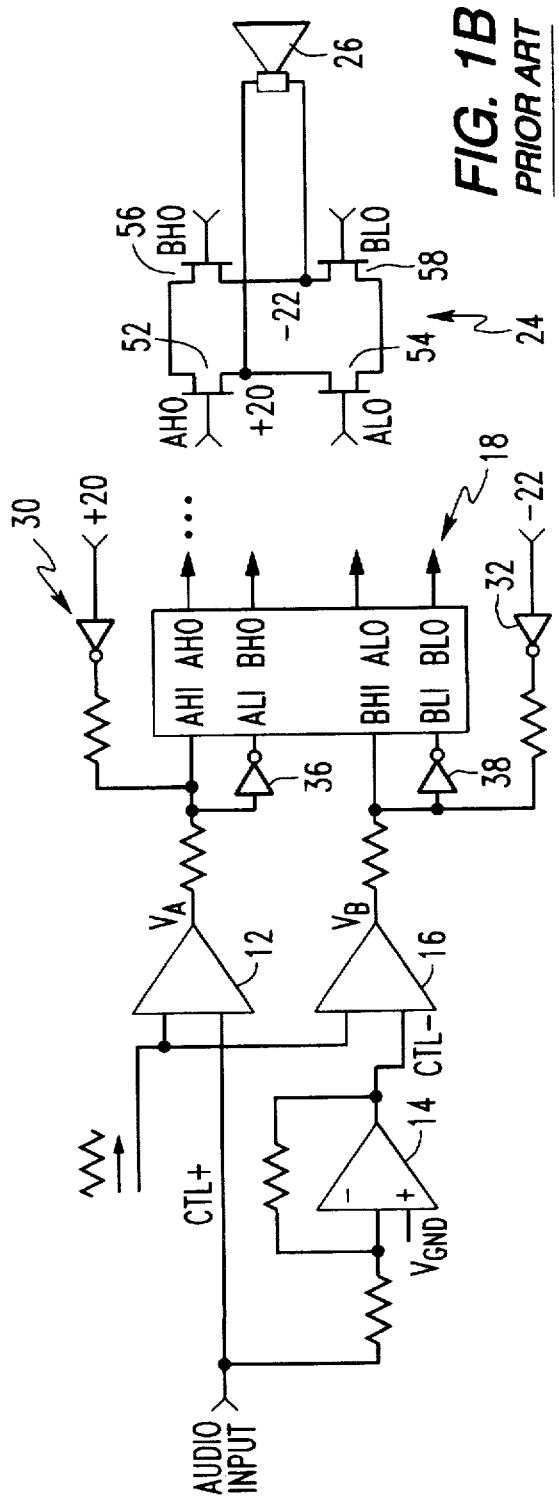
FIG. 1B shows a prior art dual comparator pwm amplifier.
Figure 2A:
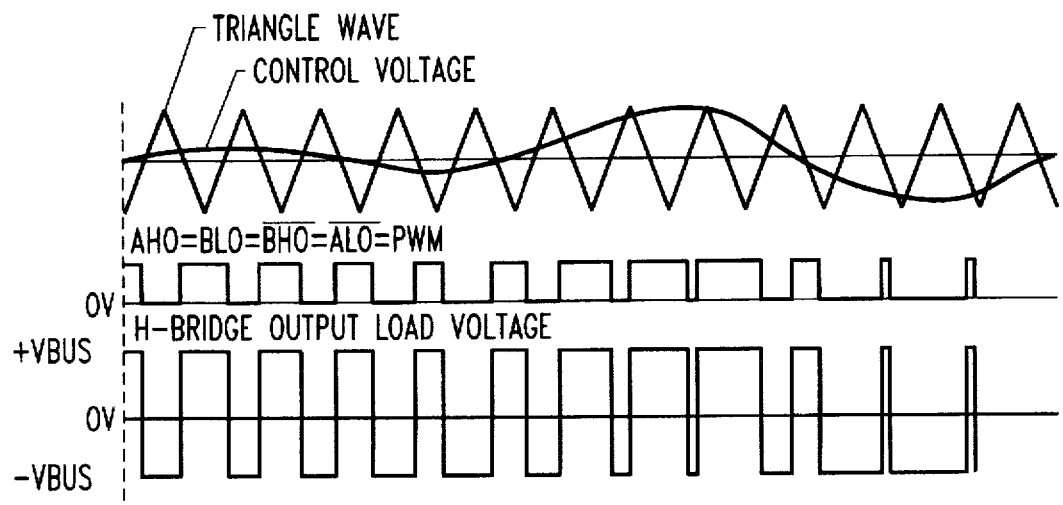
FIG. 2A shows operating wave forms for the single pwm amplifier of FIG. 1.
Figure 3:
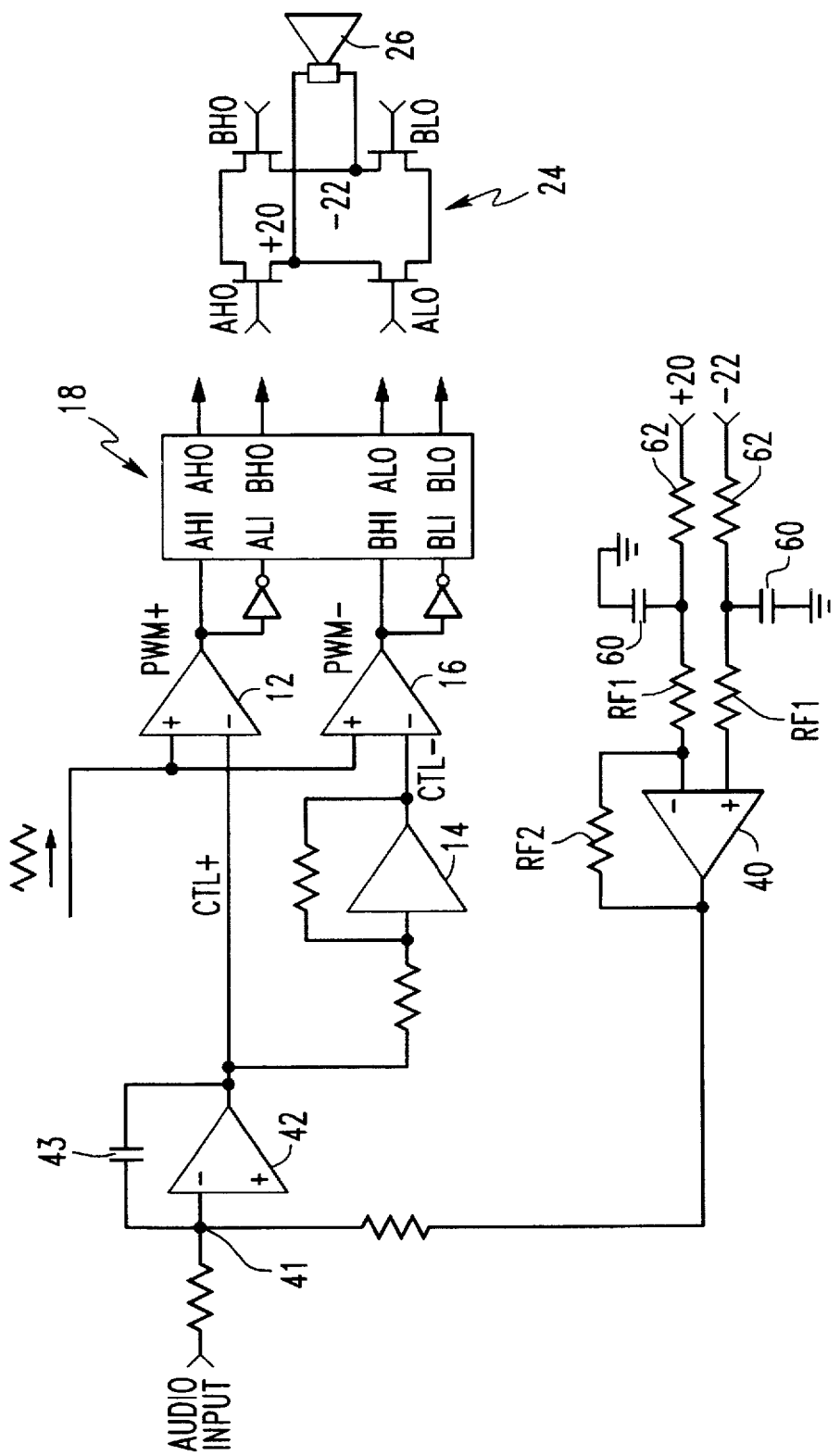
FIG. 3 shows a closed loop dual comparator pwm amplifier with a differential signal ended and integrating feedback loop.

FIG. 3 shows the dual comparator single feedback loop pwm amplifier of the invention. Like references numerals in FIG. 3 refer to like components in FIGS. 1A and 2A. The H-bridge outputs at terminals 20, 22 are fed into a differential amplifier 40 which produces a single ended output signal. Each of the inputs to 40 pass through a low pass filter comprising a capacitor 60 and a resistor 62. The low pass filters limit the slew rate of the differential amplifier inputs to be less than the slew rate of the amplifier 40 to reduce distortion. The output of 40 is an inverted representation of the voltage across the speaker and is also opposite in sign to the audio input. The resistors RF1 and RF2 scale the voltage level of the output of the amplifier 40 to the voltage level of the audio input.

The feedback signal from 40 is applied to the summing node 41. The audio input is also applied to he summing node 41. The voltage at the summing node 41 represents the difference between the audio input and the amplifier output and is commonly referred to as the error signal. The error signal is applied to the integrator 42 that has feedback capacitor 43. The output of the integrating amplifier 42 is the control signal CTL+ for one side of the H-bridge 24, i.e. for AHO and ALO. Signal CTL+ is coupled to an inverting amplifier 14 to generate a second control signal CTL− which controls the other side of the H bridge 24, i.e. BHO and BLO.

The complimentary control signals CTL+ and CTL− are input to the pwm comparators 12 and 16 respectively. A modulating triangle wave reference signal is also input to both comparators 12, 16. Comparators 12, 16 and inverters 36, 38 generate the gate driver input signals including a first pair of complementary input low voltage gate driver signals, AHI, ALI, and a second pair of complementary gate driver signals, BHI, BLI. The gate driver circuit 18 generates the output high voltage drive signals, AHO, ALO,BHO, BLO required to drive the gates of the high current transistors (mosfets) of the H-bridge. The output gate driver signals are applied to the gates of the mosfets in the full bridge 24 and the speaker 26 is connected across the bridge between terminals 20 and 22.

Figure 2B:
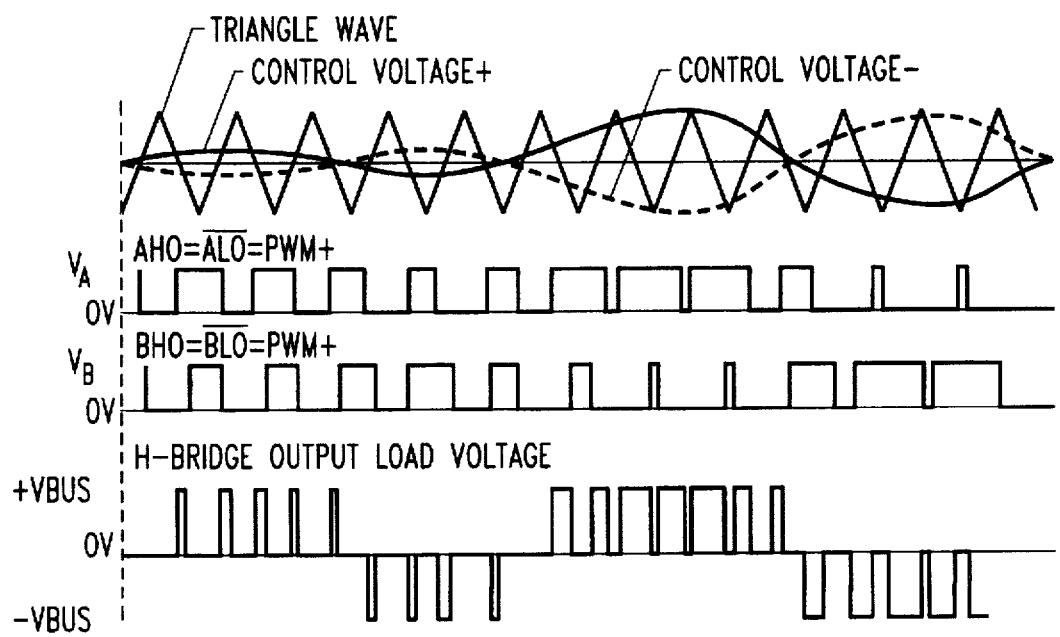
FIG. 2B shows operating wave forms for the for the dual pwm, dual feedback loop amplifier of FIG. 1b.

In operation, the drive signals at output terminals 20, 22 of the H-bridge are square wave pulses similar to the H-bridge output pulses shown in FIG. 2B and they drive the speaker 26. The outputs 20, 22 are also connected to the filters 60, 62 of the differential amplifier 40. The filtered output signals are input to amplifier 40. The single ended output of amplifier 40 is a feedback signal representing the output of the Class D amplifier. The feedback signal is summed with the audio input at a node 41 to provide the error signal. The integrator 42 receives the error signals and generates an output signal CTL+. An inverter 14 coupled to the output CTL+ generates a complementary control signal CTL−. The integrator 42 performs two functions. First, it integrates the error signal on node 41. Using integrator 42 in that way will adjust the gate driver control signals CTL+ and CTL− until the error signal is driven to zero and the output is exactly equal to the audio input. Second, it provides reconstruction filtering. Since the feedback signal output from 40 is still pulse-like, the integrator 42 will smooth the control signals CTL+ and CTL− which are used by the pwm comparators 12, 16. The modulating reference triangle wave signals are coupled to both comparators 12, 16. The inverters 36, 38 then generate the complementary gate driver signals AHI, ALI, BHI, BLI.

I claim:

1. A switching audio amplifier comprising:
   first and second comparators, each receiving a modulating reference signal and receiving one of first and second complementary comparator control signals and generating respective first and second control signals;
   a gate driver circuit for controlling a full bridge and coupled to the first and second control signals for generating first and second pairs of complementary output gate driver signals;
   an full output bridge comprising a first pair of power transistors on one side of bridge and coupled to the first pair of complementary output gate driver signals for driving gates of the first pair of transistors and a second pair of power transistors on the other side of the bridge and coupled to the second pair of complementary output gate driver signals for driving the gates of the second pair of transistors;
   a differential amplifier having one input coupled to one side of the full bridge and another input coupled to the other side of the full bridge and an output feedback signal representative of the voltage across the bridge outputs;
   an integrating error amplifier circuit for receiving and summing an audio input and the output feedback signal and generating the first and second complementary comparator control signals.

2. The audio amplifier of claim 1 wherein the error amplifier comprises an inverter for generating a complementary comparator control signal.

3. The audio amplifier of claim 1 wherein the bridge comprises four power mosfet devices.

4. The audio amplifier of claim 1 wherein the power transistors comprise quasi vertical dmos transistors.

5. The audio amplifier of claim 1 wherein the error amplifier is an integrator.

6. The audio amplifier of claim 1 wherein the output bridge is directly connected to a load without an intervening filter.

7. A dual comparator closed loop audio amplifier comprising:

an input amplifier for receiving, summing and integrating an audio input signal and an error signal and generating complementary output control signals;

a pair of comparators, one for comparing a modulating reference voltage to one of the complementary control signals and the other for comparing the modulating reference voltage to the other complementary control signal, each comparator generating a pulse width modulated output signal whose widths are proportional to the respective differences between the reference voltage and the complementary control voltages;

an output bridge responsive to the complementary control voltages for generating a pair of outputs that drive a load in proportion to the input audio signal;

a differential amplifier coupled to the outputs of the bridge for generating the error signal which is proportional to the load across the bridge.

* * * * *